(12) United States Patent
Takagi

(10) Patent No.: US 7,994,637 B2
(45) Date of Patent: Aug. 9, 2011

(54) HIGH-FREQUENCY SEMICONDUCTOR DEVICE

(75) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/651,026

(22) Filed: Dec. 31, 2009

(65) Prior Publication Data

US 2010/0102443 A1    Apr. 29, 2010

Related U.S. Application Data

(63) Continuation of application No. 11/779,904, filed on Jul. 19, 2007, now Pat. No. 7,667,322, which is a continuation of application No. PCT/JP2007/000047, filed on Feb. 1, 2007.

(30) Foreign Application Priority Data

Apr. 28, 2006   (JP) ................................ 2006-125328

(51) Int. Cl.
    *H01L 23/34*  (2006.01)
(52) U.S. Cl. .. 257/728; 257/686; 257/727; 257/E25.013
(58) Field of Classification Search .................. 257/686, 257/723–728, E25.013
    See application file for complete search history.

(56) References Cited

U.S. PATENT DOCUMENTS

| | | | |
|---|---|---|---|
| 3,223,900 A | 12/1965 | Wittwer | |
| 5,570,274 A * | 10/1996 | Saito et al. | 361/784 |
| 5,939,779 A * | 8/1999 | Kim | 257/692 |
| 6,172,423 B1 | 1/2001 | Lee | |
| 6,693,353 B1 | 2/2004 | Hirayama et al. | |
| 6,984,885 B1 | 1/2006 | Harada et al. | |
| 7,015,063 B2 | 3/2006 | Kinsman | |
| 7,242,091 B2 | 7/2007 | Ramakrishna et al. | |
| 2004/0034997 A1 | 2/2004 | Kinsman et al. | |
| 2007/0108634 A1* | 5/2007 | Higashi et al. | 257/787 |

FOREIGN PATENT DOCUMENTS

| | | |
|---|---|---|
| JP | 01-283973 | 11/1989 |
| JP | 05-037208 | 2/1993 |
| JP | 5-83010 | 4/1993 |
| JP | 06-151703 | 5/1994 |
| JP | 08-088317 | 4/1996 |

OTHER PUBLICATIONS

Translation of JP 5-83010, original document provided in IDS.
U.S. Appl. No. 12/786,942, filed May 25, 2010, Takagi.

* cited by examiner

*Primary Examiner* — Kiesha R Bryant
*Assistant Examiner* — Mark W Tornow
(74) *Attorney, Agent, or Firm* — Oblon, Spivak, McClelland, Maier & Neustadt, L.L.P.

(57) ABSTRACT

An example of a high-frequency semiconductor device includes two unit semiconductor devices. Each of the two unit semiconductor devices has a ground substrate, a high-frequency semiconductor element, an input-side matching circuit, an output-side matching circuit, a side wall member, an input terminal, and an output terminal. The ground substrate has heat-radiating property. The high-frequency semiconductor element is provided on the ground substrate. The input-side matching circuit is connected to the high-frequency semiconductor element. The output-side matching circuit is connected to the high-frequency semiconductor element. The side wall member surrounds at least the high-frequency semiconductor element. The input terminal is connected to the input-side matching circuit. The output terminal is connected to the output-side matching circuit. The two unit semiconductor devices are coupled to each other at upper edges of the side wall members.

3 Claims, 7 Drawing Sheets

HIGH-FREQUENCY SEMICONDUCTOR DEVICE

CROSS-REFERENCE TO RELATED APPLICATIONS

This application is a continuation of and claims the benefit of priority under 35 U.S.C. §120 from U.S. Ser. No. 11/779,904, filed Jul. 19, 2007, and claims the benefit of priority from PCT Application No. PCT/JP2007/000047, filed Feb. 1, 2007, which is based upon and claims the benefit of priority from the prior Japanese Patent Application No. 2006-125328, filed Apr. 28, 2006. The entire contents of each of those references are incorporated herein by reference.

BACKGROUND

1. Technical Field

The present invention relates to a high-frequency semiconductor device that includes a cavity having a space and semiconductor elements contained in the cavity.

2. Description of the Related Art

It is increasingly demanded that semiconductor devices be designed to operate at larger power in, for example, microwave communication. The recent trend is therefore to use larger microwave semiconductor chips and more number of chips in combination. As a result, the cavity containing these chips has become larger. The cut-off frequency, which is determined by the length of cavity in the direction of the orthogonal to the microwave-propagation direction, must be kept at a higher frequency than operating frequencies. The decrease in the cut-off frequency degrades the isolation from the output side to the input side.

A semiconductor device is known, which is designed to prevent such degradation of the (see Patent Document 1: Jpn. Pat. Appln. Laid-Open Publication No. 5-83010, FIG. 1). As shown in FIG. 1, the cavity of this device is portioned by a grounding conductor, thereby to avoid characteristic degradation such as a decrease in the cut-off frequency. The cavity of this device has length a1, width b1 and height c1 (not shown). That is, this conventional semiconductor device has a plurality of semiconductor elements arranged in the widthwise direction.

This configuration, wherein semiconductor elements are arranged in the widthwise direction, has a problem in respect of radiation of heat because it operates at large power. More precisely, heat cannot be well radiated from the back of the device since many semiconductor elements are arranged in the device package having a small width and inevitably lie close to each other.

Further, gaps are likely to develop between the package cover and the partition walls provided in the package. Such gaps will degrade the device characteristics. This is one of the causes of the decrease in the device productivity.

BRIEF SUMMARY OF THE INVENTION

According to an aspect of the present invention, there is provided an example of a high-frequency semiconductor device that includes two unit semiconductor devices. Each unit semiconductor device includes a ground substrate, a high-frequency semiconductor element, an input-side matching circuit, an output-side matching circuit, a side wall member, an input terminal and an output terminal. The ground substrate has heat-radiating property. The high-frequency semiconductor element is provided on the ground substrate. The input-side matching circuit is connected to the high-frequency semiconductor element. The output-side matching circuit is connected to the high-frequency semiconductor element. The side wall member surrounds at least the high-frequency semiconductor element. The input terminal is connected to the input-side matching circuit. The output terminal is connected to the output-side matching circuit. The two unit semiconductor devices are coupled to each other at upper edges of the side wall members.

According to another aspect of the present invention, there is provided another example of a high-frequency semiconductor device that includes two unit semiconductor devices. Each unit semiconductor device includes a ground substrate, a high-frequency semiconductor element, an input-side matching circuit, an output-side matching circuit, a side wall member, an input terminal, and an output terminal. The ground substrate has heat-radiating property. The high-frequency semiconductor element is provided on the ground substrate. The input-side matching circuit is connected to the high-frequency semiconductor element. The output-side matching circuit is connected to the high-frequency semiconductor element. The side wall member surrounds at least the high-frequency semiconductor element. The input terminal is connected to the input-side matching circuit. The output terminal is connected to the output-side matching circuit. The two unit semiconductor devices are coupled to each other through a conductive plate at upper edges of the side wall members.

PREFERRED EMBODIMENTS

The embodiments will be described, with reference to the accompanying drawings. According to the embodiments, two unit semiconductor devices are coupled to each other, one upon the other, constituting a high-frequency semiconductor device.

First Embodiment

Figure 2:
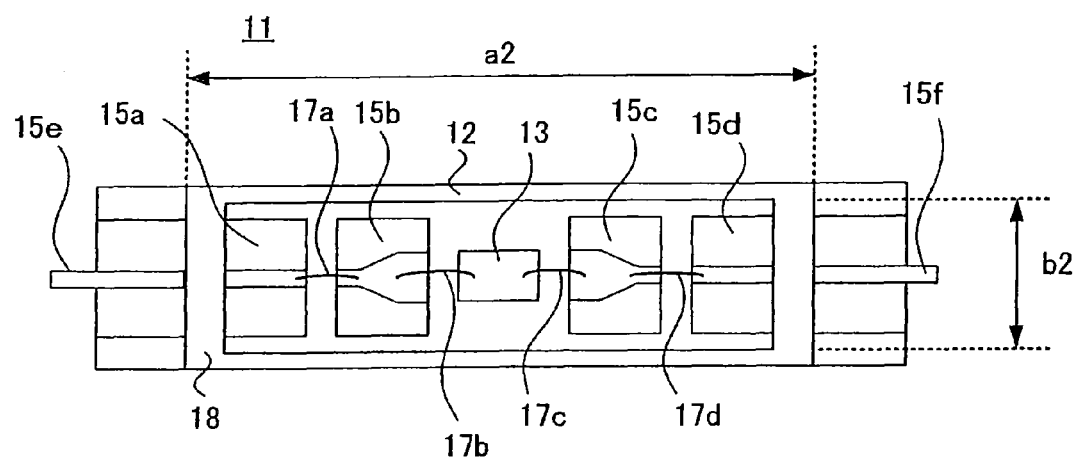
FIG. 2 is a top view showing the configuration of a unit semiconductor device according to a first embodiment.

FIG. 2 shows the configuration of a unit semiconductor device 11 according to the first embodiment. The unit semiconductor device 11 comprises a ground substrate 12, a semiconductor element such as a microwave transistor 13, an input terminal 15a, an input-side matching circuit 15b, an output-side matching circuit 15c, and an output terminal 15d. The ground substrate 12, i.e., a heat-radiating ground substrate, is made of Cu or W and can radiate heat. The microwave transistor 13, input terminal 15a, input-side matching circuit 15b, output-side matching circuit 15c and output terminal 15d are provided on the heat-radiating ground substrate 12. The semiconductor element is for use at high frequencies. It is, for example, a microwave transistor 13. The input terminal 15a and input-side matching circuit 15b are arranged on one side of the microwave transistor 13. The output-side matching circuit 15c and output terminal 15d are arranged on the other side of the microwave transistor 13.

The input terminal 15a and the input-side matching circuit 15b are connected by a lead line, such as gold wire 17a. The input-side matching circuit 15b and the microwave transistor 13 are connected by a gold wire 17b. The microwave transistor 13 and the output-side matching circuit 15c are connected by a gold wire 17c. The output-side matching circuit 15c and the output terminal 15d are connected by a gold wire 17d.

As shown in FIG. 2, the microwave transistor 13 and the matching circuits 15b and 15c are surrounded by a sidewall 18. Nonetheless, the input terminal 15a and output terminal 15d are exposed in part.

Figure 3:
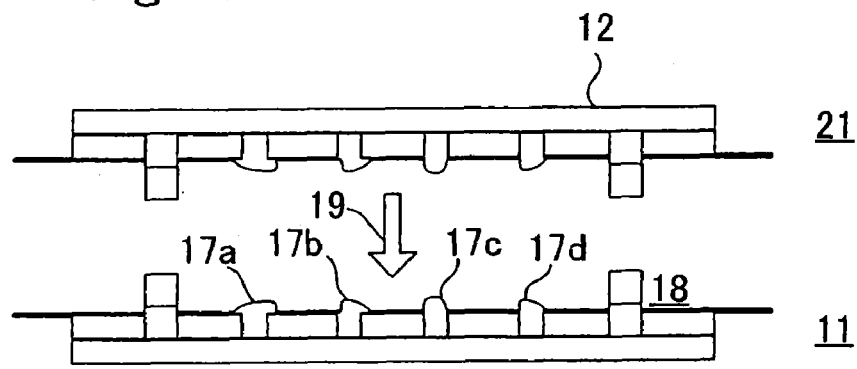
FIG. 3 is a front view explaining how two unit semiconductor devices are coupled to each other in the first embodiment.

As FIG. 3 shows, a unit semiconductor device 21 of the same structure as the unit semiconductor device 11 is positioned upside down and laid on the unit semiconductor device 11. The device 21 is arranged as indicated by arrow 19, with its sidewall 28 aligned with the sidewall 18 of the unit semiconductor device 11 located below the device 21.

Figure 4:
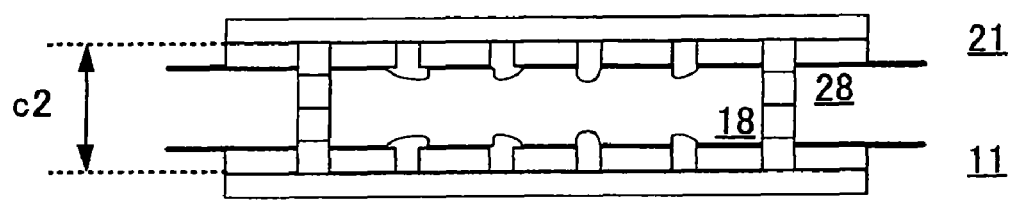
FIG. 4 is a front view showing the two unit semiconductor devices coupled together in the first embodiment.
Figure 5:
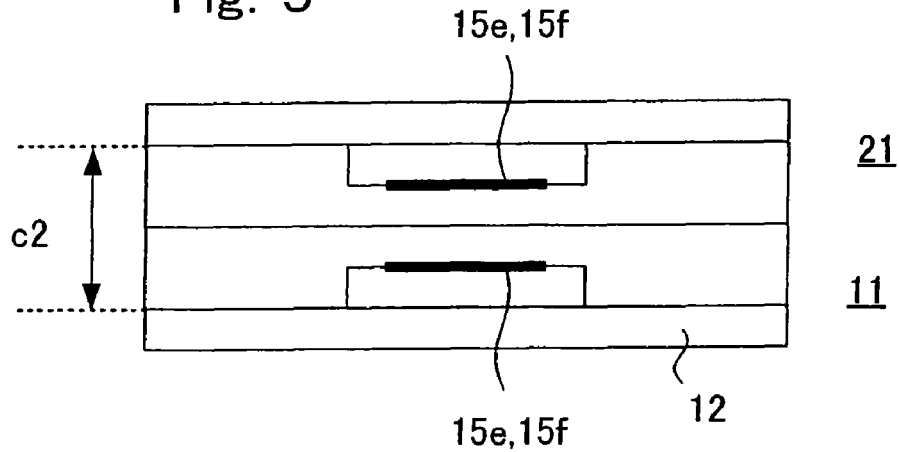
FIG. 5 is a side view showing the two unit semiconductor devices coupled together in the first embodiment.

As shown in FIG. 4, the upper edge of the sidewall 28 of the unit semiconductor device 21 abuts on the upper edge of the sidewall 18 of the unit semiconductor device 11. The sidewalls 18 and 28 are coupled together at upper edge with of solder made of, for example, a gold-tin alloy. FIG. 5 is a side view of the resultant product.

The upper limit of the frequency range which can be used is determined by the resonance frequency in the cavity. At any frequency higher than the upper limit, the isolation between the terminals is impaired and power is dissipated into the space. Resonance frequency f is expressed as follows:

$$f = (\lambda c/2) \times SQRT[(m/a)^2 + (n/b)^2 + (k/c)^2]$$

where a, b and c are the length, width and height of the cavity, respectively, $\lambda c$ is the velocity of light in the atmosphere, and m, n and k are integers.

Resonance frequency f varies with the distribution of the magnetic field generated in the cavity. What are problematical are seven modes, each having a low resonance frequency. The resonance frequencies of these modes are given as follows:

$$f(TE100) = (\lambda c/2) \times (1/a) \quad (1)$$

$$f(TE010) = (\lambda c/2) \times (1/b) \quad (2)$$

$$f(TE001) = (\lambda c/2) \times (1/c) \quad (3)$$

$$f(TE110) = (\lambda c/2) \times SQRT[(1/a)^2 + (1/b)^2] \quad (4)$$

$$f(TE101) = (\lambda c/2) \times SQRT[(1/a)^2 + (1/c)^2] \quad (5)$$

$$f(TE011) = (\lambda c/2) \times SQRT[(1/b)^2 + (1/c)^2] \quad (6)$$

$$f(TE111) = (\lambda c/2) \times SQRT[(1/a)^2 + (1/b)^2 + (1/c)^2] \quad (7)$$

where SQRT is a square root.

Let a1, b1 and c1 be the length, width and height of the cavity of the conventional semiconductor device composed of two parts split in the vertical direction. Similarly, let a2, b2 and c2 be the length, width and height of the cavity of the semiconductor device according to the present embodiment. Then, the length a2 and width b2 of the cavity according to the present embodiment will be as shown in FIG. 2, and the height c2 thereof will be as shown in FIG. 4.

Length a1 and length a2 are determined by the matching circuits. The length of the cavity of this embodiment is the same as that of the cavity of the conventional device. That is, a1=a2. The width of the cavity is constant, not depending on the number of semiconductor chips provided in the cavity. In the conventional semiconductor device, two chips are arranged side by side. In the present embodiment, one chip is divided into two segments in the widthwise direction, and the cavity is therefore half (½) as wide as the cavity of the conventional device. That is, b2=b1/2.

The cavity of the embodiment is twice as high as that of the conventional device, because the unit semiconductor devices 11 and 21 are laid one on the other. That is, c2=2×c1.

According to the present embodiment, there are two heat-radiating ground substrates 12, which define external surfaces of the semiconductor device. Heat can therefore be radiated far more readily, compared to the conventional semiconductor device.

Second Embodiment

In this embodiment, the unit semiconductor device 21 is laid on the lower unit semiconductor device 11. Therefore, it may be difficult, in some cases, to connect or ground signal lines. This would not happen in the second embodiment. The second embodiment will be described below.

Figure 6:
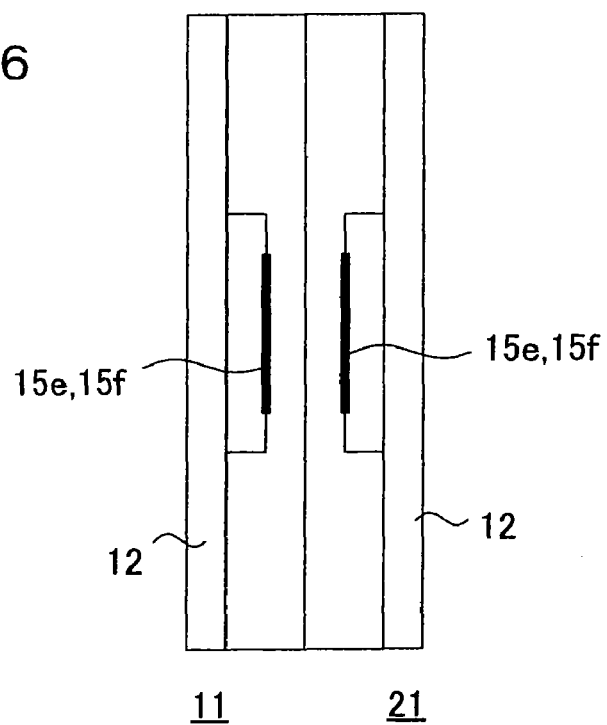
FIG. 6 is a diagram illustrating the combination of the two unit semiconductor devices (shown in FIG. 5) coupled together, which is positioned upright.

FIG. 5 shows a combination of the two unit semiconductor devices 11 and 21 according to the first embodiment. The second embodiment is such a combination of two unit devices, which is positioned upright and stands on one side as is illustrated in FIG. 6.

Figure 7:
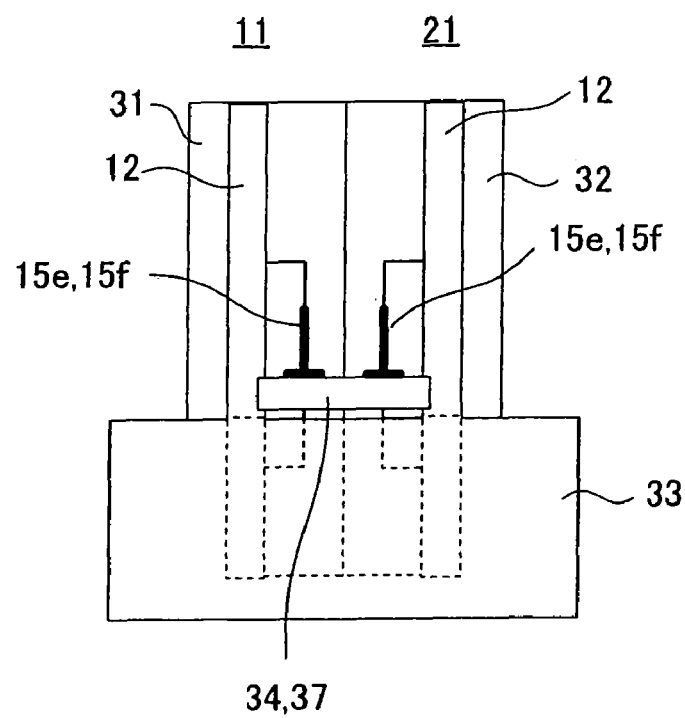
FIG. 7 is a side view of a semiconductor device according to a second embodiment.

The devices 11 and 21 have been positioned upright. Then one end of the devices 11 and 21 is embedded in a grounding conductor 33 capable of radiating heat, as is illustrated in FIG. 7. Thereafter, auxiliary grounding conductors 31 and 32, both able to radiate heat, are secured to the other end of the devices 11 and 21, which are not embedded in the grounding conductor 33. These conductors 31 and 32 are arranged as if clamping those remaining parts of the devices 11 and 21. An input-side external circuit 34 is provided on the input side of the grounding conductor 33 capable of radiating heat and is connected to the projecting part 15e of the input terminal 15a. Similarly, an output-side external circuit 37 is provided on the output side of the grounding conductor 33 and is connected to the projecting part 15f of the output terminal 15d.

Figure 8:
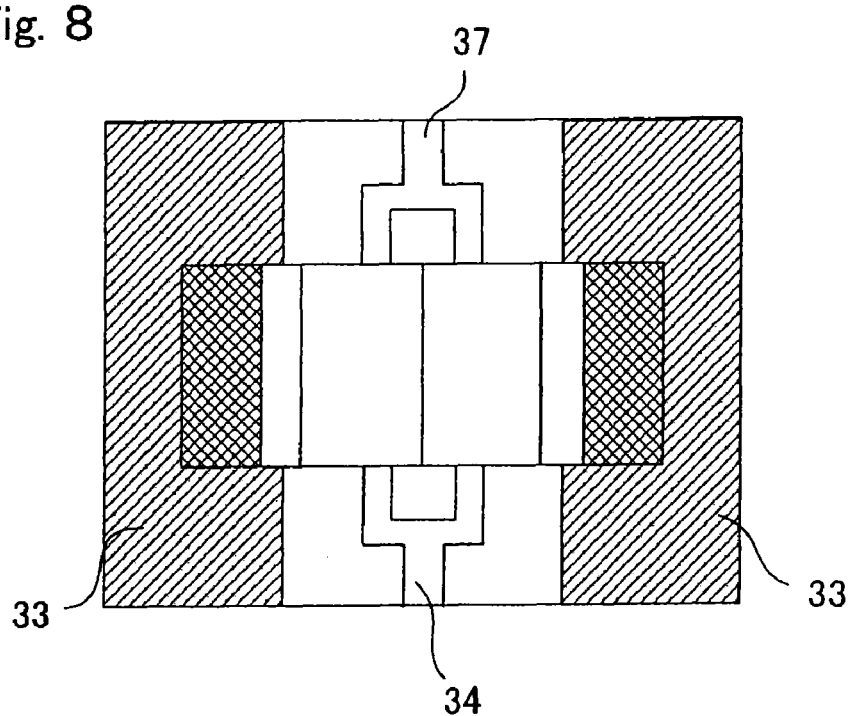
FIG. 8 is a top view of the semiconductor device according to the second embodiment.

FIG. 8 shows this semiconductor device for use at high frequencies, as is viewed from above. As seen from FIG. 8, signal lines can be easily grounded to provide a high-frequency semiconductor device that comprises two unit semiconductor devices.

In the second embodiment, it is easy to connect the signal lines to the ground. In addition, heat can be efficiently radiated from two surfaces defined by the auxiliary grounding conductors 31 and 32 that have heat-radiating property.

Third Embodiment

Figure 9:
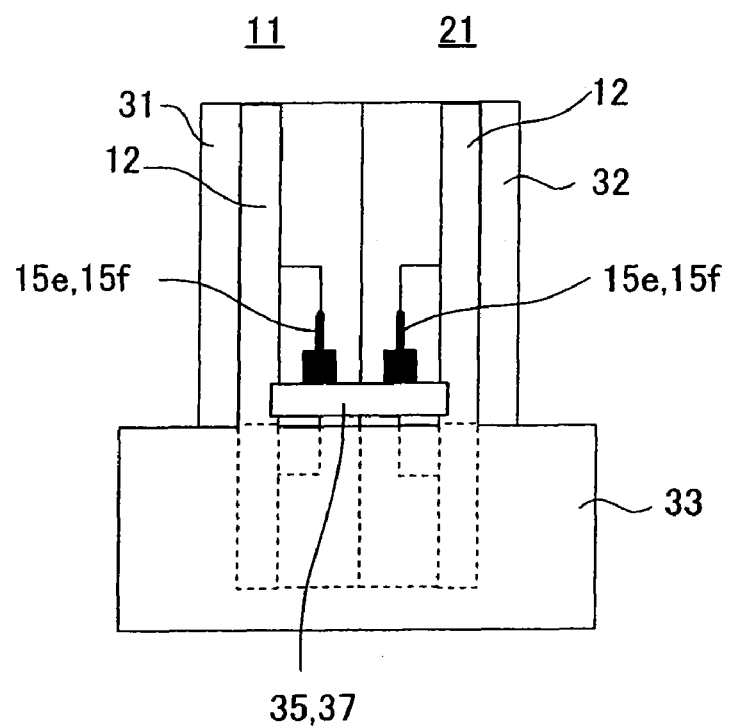
FIG. 9 is a side view of a semiconductor device according to a third embodiment.

A third embodiment will be described. FIG. 9 shows the structure of the third embodiment. In this embodiment, the projecting part 15e of the input terminal 15a and the projecting part 15f of the output terminal 15d, both shown in FIG. 5, are twisted and led outside.

As FIG. 9 shows, the projecting part 15f of the output terminal is twisted and let outside. The grounding connection is the same as in the embodiment shown in FIG. 7. In the present embodiment, the projecting part 15e of the input terminal and the input-side external circuit 34 contact in a surface, and the projecting part 15f of the output terminal and the output-side external circuit 37 contact in a surface. Thus, the embodiment provides a high-frequency semiconductor device in which the signal lines can be easily connected and grounded.

Also in this embodiment, heat can be efficiently radiated from two surfaces defined by the auxiliary grounding conductors 31 and 32 that have heat-radiating property.

Fourth Embodiment

In each high-frequency semiconductor device described above, two unit semiconductor devices 11 and 21 are directly coupled, constituting a semiconductor device for use at high frequencies.

A conductive plate made of metal can be provided between two unit semiconductor devices 11 and 21 in order to prevent microwave interference between the unit semiconductor devices.

Figure 10:
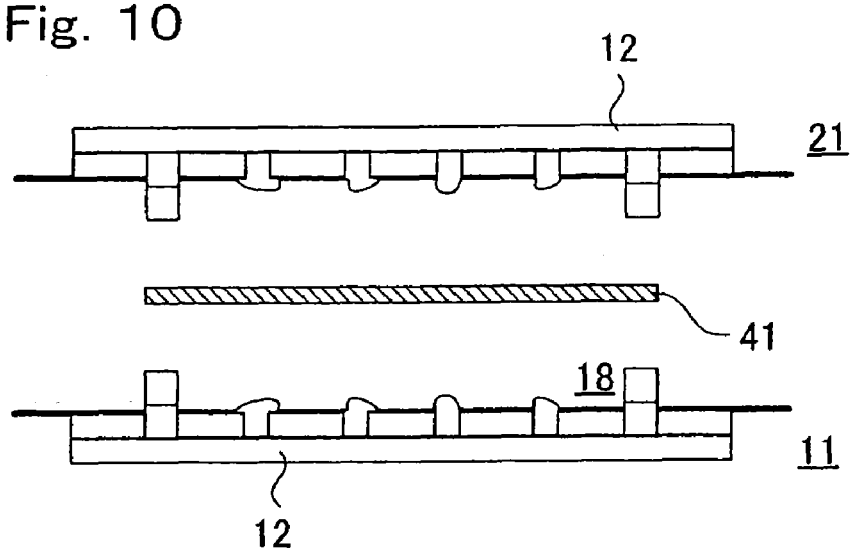
FIG. 10 is a front view explaining how two unit semiconductor devices are coupled to each other in a fourth embodiment.
Figure 11:
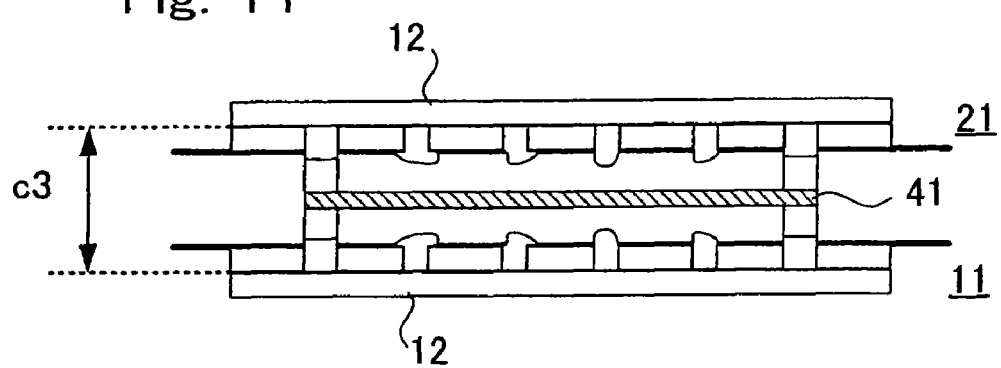
FIG. 11 is a front view showing the two unit semiconductor devices coupled together in the fourth embodiment.
Figure 12:
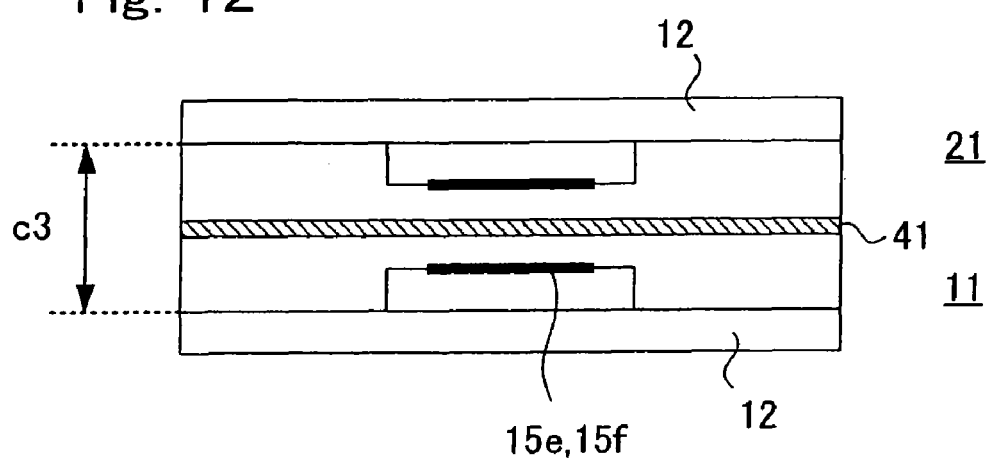
FIG. 12 is a side view showing the two unit semiconductor devices coupled together in the fourth embodiment.

FIGS. 10 and 11 show a high-frequency semiconductor device of such a configuration. FIG. 10 is a diagram explaining how a conductive plate 41 is interposed between unit semiconductor devices 11 and 21. FIG. 11 is a sectional view of a structure comprising the unit semiconductor devices 11 and 21 secured to each other, with the conductive plate 41 interposed between them.

Figure 1:
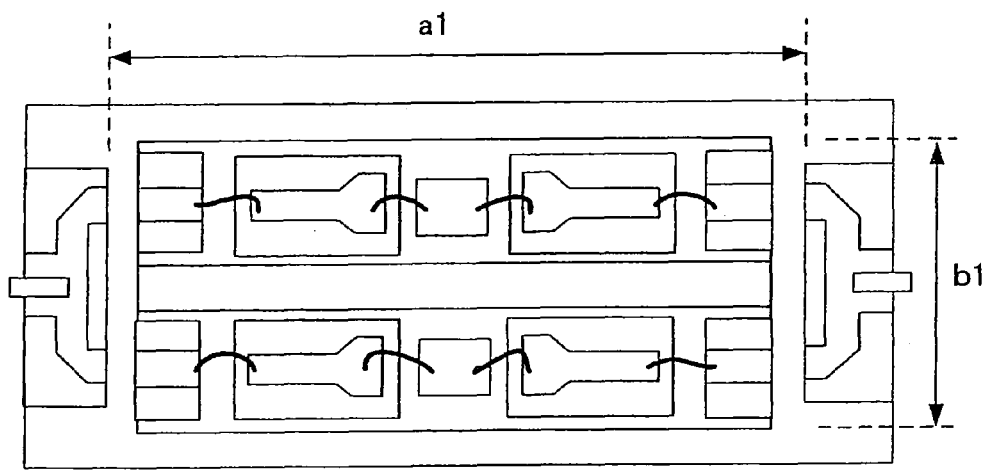
FIG. 1 is a top view showing the configuration of a conventional semiconductor device.

The unit semiconductor devices 11 and 21 are identical in configuration to those shown in FIG. 1. This embodiment differs only in that the conductive plate 41 is interposed and secured between the unit semiconductor devices 11 and 21. That is, the conductive plate 41 is laid on the unit semiconductor device 11 so configured as described above and the unit semiconductor device 21 of the same structure as the device 11 is positioned upside down and laid on the conductive plate 41.

It is good enough if the conductive plate 41 is made of metal. It is desired that the plate 41 should have an expansion coefficient similar to that of the heat-radiating ground substrate 12. Preferably, it should be made of the same material as the heat-radiating ground substrate 12. It is sufficient for the conductive plate 41 to be as large as would cover at least the sidewall 18. It is desired that the plate 41 be thick enough not to allow the passage of microwaves having a wavelength of 5 µm or more. It may be about 1 mm thick, in consideration of the handling readiness required.

The sidewall 18 of the upper unit semiconductor device 21 is so arranged that its upper edge is aligned with the upper edge of the sidewall 18 of the lower unit semiconductor device 11, with the conductive plate 41 clamped between the devices 11 and 21. The sidewalls of the devices 11 and 21 are coupled and sealed together at upper edge with of solder made of, for example, a gold-tin alloy.

In the present embodiment with the conductive plate 41, the resonance frequency can be raised in any mode other than mode TE001, without lowering the resonance frequency of mode TE001.

In the present embodiment, there are two heat-radiating ground substrates 12, which define external surfaces of the semiconductor device. Heat can therefore be radiated at high efficiency.

Fifth Embodiment

Figure 13:
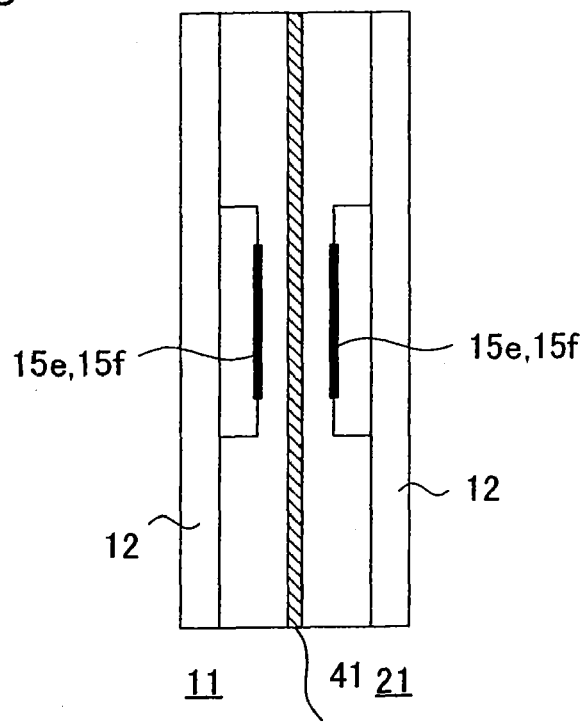
FIG. 13 is a diagram illustrating the combination of the two unit semiconductor devices (shown in FIG. 12) coupled together, which is positioned upright.
Figure 14:
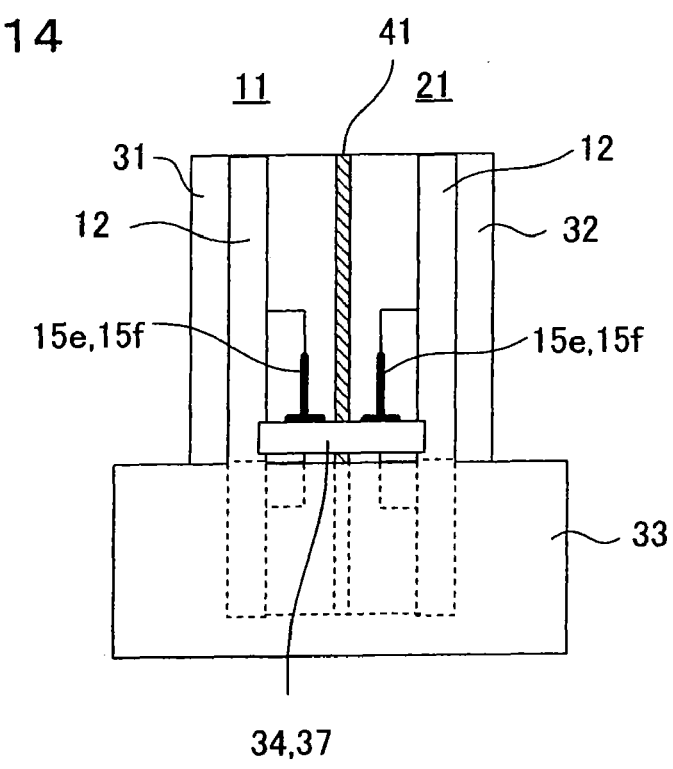
FIG. 14 is a side view of a semiconductor device according to a fifth embodiment.
Figure 15:
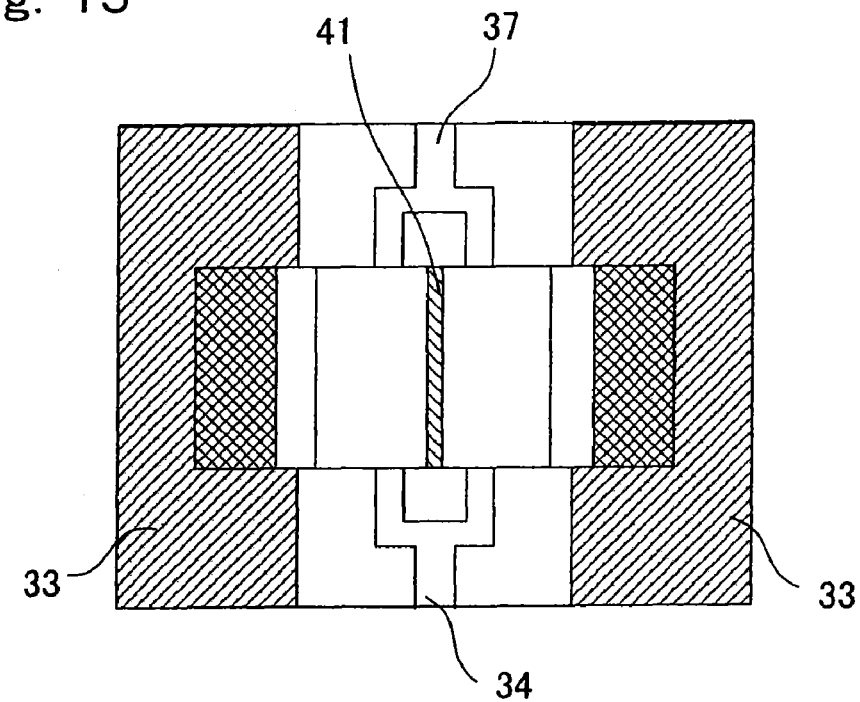
FIG. 15 is a top view of the semiconductor device according to the fifth embodiment.
Figure 16:
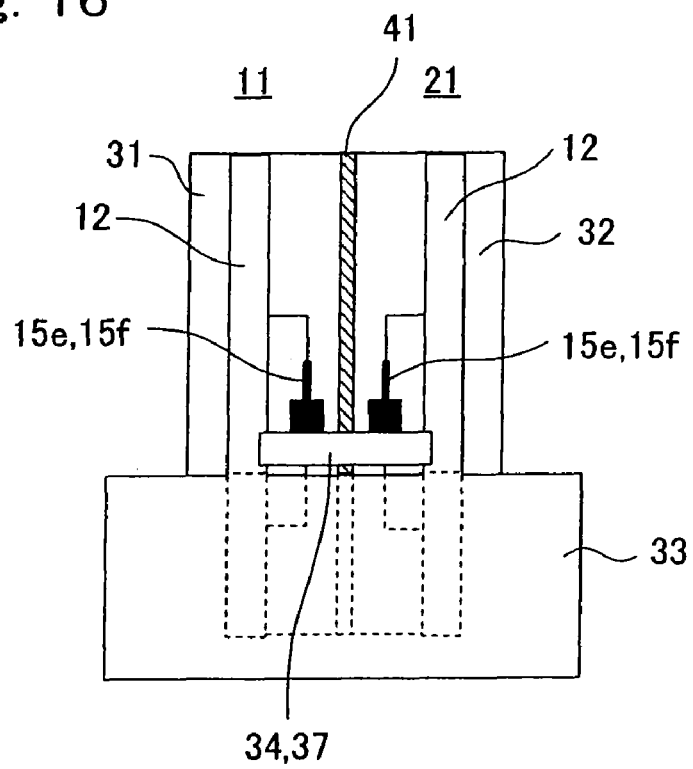
FIG. 16 is a side view of a semiconductor device according to a sixth embodiment.

FIGS. 14, 15 and 16 show the fifth embodiment. This embodiment differs from the embodiment shown in FIGS. 7, 8 and 9, only in that a conductive plate 41 is interposed between the two unit semiconductor devices 11 and 21. FIG. 13 shows the device that comprises two unit semiconductor devices 11 and 21 and a conductive plate 41 interposed between the devices 11 and 21. As shown in FIG. 14, this device is positioned upright and stands on one side. Thereafter, auxiliary grounding conductors 31 and 32, both able to radiate heat from the rear surface, are connected and secured to the heat-radiating ground substrates 12 of the device.

The unit semiconductor devices 11 and 21 are secured to the auxiliary grounding conductors 31 and 32, respectively. The conductive plate 41 is clamped between the unit semiconductor devices 11 and the unit semiconductor device 21. One end of the two unit semiconductor devices 11 and 21 and the conductive plate 41 is embedded in a grounding conductor 33. The grounding conductor 33 is capable of radiating heat (see FIG. 15).

Thereafter, auxiliary grounding conductors 31 and 32, both able to radiate heat, are secured to the other end of the devices 11 and 21, which are not embedded in the grounding conductor 33. These conductors 31 and 32 are arranged as if clamping those remaining parts of the devices 11 and 21. An input-side external circuit 34 is provided on the input side of the grounding conductor 33 capable of radiating heat and is connected to the projecting part 15e of the input terminal. Similarly, an output-side external circuit 37 is provided on the output side of the grounding conductor 33 and is connected to the projecting part 15f of the output terminal.

FIG. 15 shows this high-frequency semiconductor device as viewed from above. As seen from FIG. 15, signal lines can be easily grounded to provide a high-frequency semiconductor device that comprises two unit semiconductor devices and a conductive plate 41 interposed between the unit semiconductor devices.

In the fifth embodiment, heat can be efficiently radiated from two surfaces defined by the auxiliary grounding conductors 31 and 32 that have heat-radiating property.

Sixth Embodiment

Still another embodiment will be described, with reference to FIG. 14. In this embodiment, the projecting part 15e of the input terminal and the projecting part 15f of the output terminal, both shown in FIG. 14, are twisted and led outside. FIG. 16 shows the structure of the sixth embodiment. As FIG. 16 shows, the projecting part 15f of the output terminal is twisted and let outside. This embodiment is identical to the fifth embodiment shown in FIG. 14 in any other structural respects, such as grounding connection.

In the present embodiment, the projecting part 15e of the input terminal and the input-side external circuit 34 contact in a surface, and the projecting part 15f of the output terminal and the output-side external circuit 37 contact in a surface. Thus, the embodiment provides a high-frequency semiconductor device in which the signal lines can be easily connected and grounded.

In this embodiment, heat can be efficiently radiated from two surfaces defined by the auxiliary grounding conductors 31 and 32 that have heat-radiating property.

In the fourth, fifth and sixth embodiments, a conductive plate are interposed between the two unit semiconductor devices 11 and 21. The conductive plate can therefore prevent microwave interference between the unit semiconductor devices 11 and 21.

A conventional semiconductor device, the device disclosed in Patent Document 1, and the devices according to the first embodiment and the fourth embodiment were examined for resonance frequency. The results were as shown in Table 1 (for the devices having a cavity of relatively small height) and as shown in Table 2 (for the devices having an cavity of relatively large height).

TABLE 1

2c < (a or b)
a = 1.0 cm, b = 1.0 cm, c = 0.4 cm (Unit: GHz)

| Mode | Prior Art | Patent Document 1 | First Embodiment | Fourth Embodiment |
|---|---|---|---|---|
| TE100 | 15.0 | 15.0 | 15.0 | 15.0 |
| TE010 | 15.0 | 30.0 | 30.0 | 30.0 |
| TE001 | 75.0 | 75.0 | 37.5 | 75.0 |
| TE110 | 21.2 | 33.5 | 33.5 | 33.5 |
| TE101 | 76.5 | 76.5 | 40.4 | 76.5 |
| TE011 | 76.5 | 80.8 | 48.0 | 80.8 |
| TE111 | 77.9 | 82.2 | 50.3 | 82.2 |

TABLE 2

2c > (a or b)
a = 1.0 cm, b = 1.0 cm, c = 0.6 cm (Unit: GHz)

| Mode | Prior Art | Patent Document 1 | First Embodiment | Fourth Embodiment |
|---|---|---|---|---|
| TE100 | 15.0 | 15.0 | 15.0 | 15.0 |
| TE010 | 15.0 | 30.0 | 30.0 | 30.0 |
| TE001 | 25.0 | 25.0 | 12.5 | 25.0 |
| TE110 | 21.2 | 33.5 | 33.5 | 33.5 |
| TE101 | 29.2 | 29.2 | 19.5 | 29.2 |
| TE011 | 29.2 | 39.1 | 32.5 | 39.1 |
| TE111 | 32.8 | 41.8 | 35.8 | 41.8 |

Consider devices whose cavity has a relatively small height (c), even twice as much being less than the length (a) or the width (b). Assume that a conventional device has length a1 of 1.0 cm, width b1 of 1.0 cm and height c1 of 0.4 cm. By contrast, the cavity of the device according to this embodiment has length a2 of 1.0 cm, width b2 of 0.5 cm and height c2 of 0.8 cm. Thus, the cavity of the device according to this embodiment has a height twice the height of the cavity of the conventional device. The width of the cavity can yet be half the length. Hence, the resonance frequency in the cavity can be raised.

The following can be understood from the results shown in Table 1. In mode TE100, the resonance frequency is the same (i.e., 15.0 GHz) in any device examined, irrespective of its configuration. In mode TE010 and mode TE110, the device according to Patent Document 1 and the devices according to the first and fourth embodiments are advantageous over the conventional semiconductor device (that is, the resonance frequency is higher). In mode TE001, mode TE101, mode TE011 and mode TE111, only the first embodiment has the opposite effect.

In the device according to the first embodiment that has no conductive plates, the resonance frequency is improved in mode TE010 that more adversely influences the isolation characteristic between terminals than any other mode. The resonance frequency is not improved in mode TE100, because this mode does not influence the isolation at all. In other modes, the resonance frequency is lower than in the device of the conventional configuration. Nonetheless, in mode TE010 and mode TE110, i.e., two modes which have relatively low resonance frequencies, among the five modes (TE010, TE001, TE110, TE011 and TE111) influencing the isolation, the resonance frequency is two times and 1.5 times as much, respectively. Thus, the resonance frequency is greatly improved in mode TE010 and mode TE110.

The cavity may have a comparatively large height. More specifically, the height (c) may be twice as much and greater than the length (a) and the width (b). For example, the cavity of the conventional semiconductor device may have length a1 of 1.0 cm, width b1 of 1.0 cm and height c1 of 0.6 cm. In this case, the results are as shown in Table 2.

In mode TE100, the device according to Patent Document 1 and the devices according to the first and fourth embodiments are just the same as the conventional device in terms of resonance frequency. In mode TE100, mode TE110 and mode TE011, any configuration can raise the resonance frequency over the conventional devices.

In mode TE001, the device according to the first embodiment undergo resonance at lower frequencies than in any other mode. In mode TE101 and mode TE111, only the first embodiment has the opposite effect.

In the first embodiment without conductive plates, the resonance frequency is improved in mode TE101 that more adversely influences the isolation characteristic between terminals than any other mode. The resonance frequency is not improved in mode TE100, because this mode does not influence the isolation at all. In other modes, the resonance frequency is lower than in the device of the conventional configuration. Nonetheless, in mode TE010 and mode TE110, i.e., two mode which have relatively low resonance frequencies, among the five modes (TE010, TE001, TE110, TE011 and TE111) influencing the isolation, the resonance frequency is two times and 1.5 times as much, respectively. Thus, the resonance frequency is greatly improved in mode TE010 and mode TE110. In mode TE001, whoever, the resonance frequency lowers, and the device according to the first embodiment cannot achieve the advantage desired of it. By contrast, in any device having a conductive plate, the resonance frequency can be raised in any mode other than mode TE001, without lowering the resonance frequency of mode TE001.

According to the embodiments described above, there are high-frequency semiconductor devices that have microwave transistors. However, the present invention can be applied to any other types of high-frequency semiconductor devices. Further, the unit semiconductor devices 11 and 21 need not be sealed at the upper edges of their sidewalls 18 and 28, as long as they are electrically shielded. Similarly, the devices 11 and 21 need not be sealed if their sidewalls 18 and 28 are aligned with each other at upper edge by the conductive plate 41, so long as they are electrically shielded.

Embodiments of the present invention are not limited to the embodiments described above. Various changes and modifications can be made within the scope and spirit of the invention.

What is claimed is:

1. A high-frequency semiconductor device, comprising:
   two unit semiconductor devices, each of which includes
      a ground substrate having a heat-radiating property, only one side of the ground substrate having a high-frequency semiconductor element;
      the high-frequency semiconductor element on the ground substrate;
      an input-side matching circuit connected to the high-frequency semiconductor element;
      an output-side matching circuit connected to the high-frequency semiconductor element;
      a side wall member surrounding at least the high-frequency semiconductor element;
      an input terminal connected to the input-side matching circuit; and
      an output terminal connected to the output-side matching circuit, wherein one of the two unit semiconductor devices is identical to an other of the two unit semiconductor devices, the two unit semiconductor devices are coupled to each other through a conductive plate extending from portions of the side wall members to opposing portions of the side wall members across the high-frequency semiconductor elements, and the one of the two unit semiconductor devices is positioned upside down relative to the other of the two unit semiconductor devices.

2. The high-frequency semiconductor device according to claim 1, wherein one of the input terminals has at least one part twisted and connected to an input-side external circuit.

3. The high-frequency semiconductor device according to claim 1, wherein one of the output terminals has at least one part twisted and connected to an output-side external circuit.

* * * * *